(12) United States Patent
Strom (10) Patent No.: US 7,750,622 B2
(45) Date of Patent: Jul. 6, 2010

(54) METHOD OF APPLYING THE ANALYSIS OF SCRUB MARK MORPHOLOGY AND LOCATION TO THE EVALUATION AND CORRECTION OF SEMICONDUCTOR TESTING, ANALYSIS AND MANUFACTURE

(75) Inventor: John T. Strom, North Bend, WA (US)

(73) Assignee: Rudolph Technologies, Inc., Flanders, NJ (US)

( * ) Notice: Subject to any disclaimer, the term of this patent is extended or adjusted under 35 U.S.C. 154(b) by 0 days.

(21) Appl. No.: 11/479,822

(22) Filed: Jun. 29, 2006

(65) Prior Publication Data

US 2006/0244438 A1     Nov. 2, 2006

Related U.S. Application Data

(63) Continuation of application No. 10/788,670, filed on Feb. 27, 2004, now Pat. No. 7,102,368, which is a continuation of application No. 10/046,559, filed on Oct. 27, 2001, now abandoned.

(60) Provisional application No. 60/244,432, filed on Oct. 30, 2000.

(51) Int. Cl.
*G01R 31/28* (2006.01)

(52) U.S. Cl. .................................... 324/158.1; 324/758
(58) Field of Classification Search ....................... None
See application file for complete search history.

(56) References Cited

U.S. PATENT DOCUMENTS

| 4,918,374 | A | * | 4/1990 | Stewart et al. | 324/758 |
|---|---|---|---|---|---|
| 5,065,092 | A | | 11/1991 | Sigler | |
| 5,657,394 | A | | 8/1997 | Schwartz et al. | |
| 5,758,537 | A | * | 6/1998 | Throssel | 72/458 |
| 5,869,975 | A | | 2/1999 | Strid et al. | |
| 6,118,894 | A | | 9/2000 | Schwartz et al. | |
| 6,252,981 | B1 | * | 6/2001 | Guest et al. | 382/149 |
| 6,414,477 | B1 | * | 7/2002 | Strom | 324/158.1 |
| 6,710,798 | B1 | * | 3/2004 | Hershel et al. | 348/87 |
| 7,102,368 | B2 | * | 9/2006 | Strom | 324/754 |
| 7,583,099 | B2 | * | 9/2009 | Kagami | 324/758 |
| 2005/0099196 | A1 | * | 5/2005 | Sasaki | 324/754 |

* cited by examiner

*Primary Examiner*—Vinh P Nguyen
(74) *Attorney, Agent, or Firm*—Dicke, Billig & Czaja, PLLC (57) ABSTRACT

By examining scrub mark properties (such as position and size) directly, the performance of a wafer probing process may be evaluated. Scrub mark images are captured, image data measured, and detailed information about the process is extracted through analysis. The information may then be used to troubleshoot, improve, and monitor the probing process.

28 Claims, 9 Drawing Sheets

- Wafer Setup Errors [ X, Y, Wafer Alignment and Probe Card Theta]

METHOD OF APPLYING THE ANALYSIS OF SCRUB MARK MORPHOLOGY AND LOCATION TO THE EVALUATION AND CORRECTION OF SEMICONDUCTOR TESTING, ANALYSIS AND MANUFACTURE

CROSS-REFERENCE TO RELATED APPLICATIONS

The present application is a continuation of and claims benefit of priority from allowed U.S. application Ser. No. 10/788,670, filed Feb. 27, 2004, now U.S. Pat. No. 7,102,368 which is a continuation of now abandoned U.S. application Ser. No. 10/046,559, filed Oct. 27, 2001, which claimed benefit of now abandoned U.S. provisional application Ser. No. 60/244,432, filed Oct. 30, 2000, the contents of which are each incorporated herein by reference.

TECHNICAL FIELD

Aspects of the present invention relate generally to semiconductor testing equipment, and more specifically, to methods of analyzing scrub marks.

BACKGROUND

A variety of equipment and techniques have been developed to assist manufacturers of integrated circuits for testing those circuits while still in the form of dies on semiconductor wafers. In order to quickly and selectively electrically interconnect metalized contact pads (also known as "bonding pads") on each die to electrical test equipment (known as "testers"), arrays of slender wires or other contact media are provided. The contact media are arranged on conventional printed circuit boards so as to be positionable on the metalized contact pads associated with each semiconductor die. As is well known by those of ordinary skill in the art, those printed circuit board test cards have come to be known as "probe cards" or "probe array cards", and the contact media have come to be known as "probe card pins" or "probe pins" or "probe wires".

As the component density of semiconductor circuits has increased, the number of contact pads associated with each die has increased. It is now not uncommon for a single die to have upwards of 600 pads electrically associated with each die. The metalized pads themselves may have as little as a ten μm gap there between with an on-center spacing on the order of 50 μm to 100 μm. As a result, the slender probe wires of the probe array cards have become much more densely packed. It is highly desirable that the free ends or "tips" of the probes be aligned in a common horizontal plane, as well as have the proper positioning with respect to one another within the plane so that when the probes are pressed down onto the metalized pads of an integrated circuit die by a prober machine, the probes touch down substantially simultaneously, and with equal force while being on target. As used herein, the terms "touchdown", "rest" and "first contact" have the same meaning. In the process of making electrical contact with the pads, the probes are "over traveled" causing the probes to deflect from their rest position. This movement is termed "scrub" and must be taken into account in determining whether the rest position and the over travel position of the probes are within specification for the probe card.

The assignee of the present invention has developed equipment for testing the electrical characteristics, planarity and horizontal alignment, as well as scrub characteristics of various probe cards and sells such equipment under its Precision Point™ line of probe card array testing and rework stations. A significant component of these stations is a planar working surface known as a "check plate". A check plate simulates the semiconductor die undergoing a test by a probe card while checking the above described characteristics of the probes. A suitable check plate for use with the assignee's Precision Point™ equipment is described in detail in U.S. Pat. No. 4,918,374 to Stewart et al. issued Apr. 17, 1990, the disclosure of which is incorporated herein by reference. It is sufficient for the purposes of this disclosure to reiterate that while the subject probe card is held in a fixed position the check plate is moved horizontally in steps when testing the horizontal relative positioning, and vertically in steps when testing the touchdown contact and over travel position of each probe tip. Previously, and as described in the above-identified patent, horizontal position information for each probe tip was determined by translating an isolated probe tip in steps across resistive discontinuities on the check plate. In recent years, this technique has been altered by placing a transparent, optical window in the surface contact plane of the check plate with a sufficiently large surface dimension so as to permit a probe tip to reside thereon. An electronic camera viewing the probe tip through the window digitizes the initial touch down image of the probe, and a displaced position of the probes due to "scrub" as the check plate is raised to "over travel" the probe. The initial touch down position is compared to the anticipated touch down position to assist an operator in realigning that particular probe.

Another prior art technique for determining relative probe tip positions in a horizontal (e.g. X-Y) plane is described in U.S. Pat. No. 5,657,394 to Schwartz et al., the disclosure of which is incorporated herein by reference. The system disclosed therein employs a precision movement stage for positioning a video camera into a known position for viewing probe points through an optical window. Analysis of the video image and the stage position information are used to determine the relative positions of the probe points. In systems of this type, a "reference" probe position is determined primarily through information from the video camera, combined with position information from the precision stage. If the pitch of the probes on the probe card is small enough, two or more probes can be simultaneously imaged with the video camera. The position of this adjacent probe is then referenced with respect to the "reference" probe from information from the video camera only. The camera is then moved to a third probe, adjacent to the second probe and this process is repeated until each probe on the entire probe card has been imaged.

In addition to the above devices for measuring various parameters of probe cards, equipment is available for measuring actual "scrub marks" made by probe card pins on a test wafer which has been impressed by the probe card with a prober machine. One such apparatus is manufactured by Visioneering Research Laboratory, Inc., Las Cruces, N. Mex. to provide high quality imaging of scrub marks made by a probe card and a prober machine. It is well known that scrub patterns analyzed by a probe card analysis machine do not match the scrub marks produced on a test wafer imaged by a scrub mark analysis machine. The test wafer models the surface characteristics of bonding pads on a semiconductor die. As stated above, the measurement surface on the probe 15 card analyzer is typically manufactured from hardened steel, or more recently a transparent synthetic or natural crystal such as sapphire. This probe card analysis testing surface is much harder than the aluminized surface of a semiconductor bonding pad. The typical annealed aluminum surface of a semiconductor bonding pad in fact yields under pressures applied by the semiconductor probing machine which may be on the order of 5 grams per pin. Remembering that the pin surface is very small, the pressure applied is sufficient to break the surface of the aluminum bonding pad causing the probe tip to 'dig in' during probe pin overtravel. Within a short distance, the tip of the probe pin plows so deeply into the aluminum surface that it stops even though the probe card continues its downward travel. This phenomenon has been characterized as "stubbing" by the assignee of the present invention. In contrast, the hard metal or sapphire surface of the probe card analysis machine does not yield under pressure from the probe pin. In addition, the metal or sapphire contact surface of the probe card analysis machine is highly polished and has a much lower coefficient of friction than does the aluminized surface of the semiconductor die bonding pad.

As a result, the probe pin does not stub on the probe card analysis machine, and the probe pin tip travels further than it does on the aluminized bonding pad. Furthermore, the place at which the probe pin first contacts an aluminized bonding pad (or the aluminized semiconductor test wafer which simulates the bonding pad in the scrub mark analysis machine) or "touch downs position of the probe pin is not readily discernable in the scrub mark made in the aluminum surface. The scrub mark resembles a brush stroke with a faint starting position and a deep, clearly defined ending position. Conversely, the probe card analysis machine accurately captures the touch down position of the probe pin on the measuring surface as well as its full travel across the surface without stubbing. Therefore, neither the touch down position, nor the end of travel position of the probe pin on the probe card analysis machine, matches corresponding positions on either an actual aluminum bonding pad or on a semiconductor test wafer imaged by a scrub mark analysis machine.

SUMMARY

By examining scrub mark properties (such as position and size) directly, the performance of a wafer probing process may be evaluated. Scrub mark images are captured, image data measured, and detailed information about the process is extracted through analysis. The information may then be used to troubleshoot, improve, and monitor the probing process.

DETAILED DESCRIPTION

Figure 1:
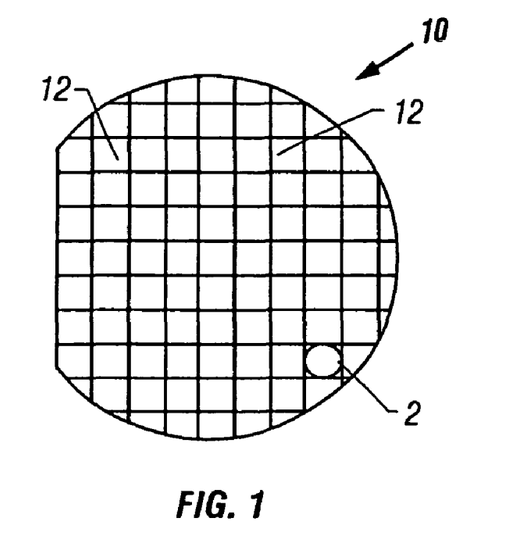
FIG. 1 is a schematic representation of a semiconductor wafer having a plurality of dies.
Figure 2:
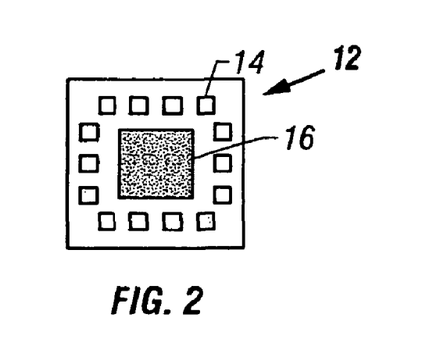
FIG. 2 is an enlarged, schematic representation of a semiconductor die indicated at circled area 2 of FIG. 1.

A semiconductor wafer is generally indicated at reference numeral 10 in FIG. 1. A semiconductor wafer has a plurality of dies 12 arranged in orthogonal rows and columns across the surface of the wafer. A conventional wafer may have a diameter of up to eight inches and anywhere from 200 up to thousands of dies per wafer depending upon the complexity of the semiconductor circuits imbedded in each die. A representative die is generally indicated at reference number 12 in FIG. 2. The die has a plurality of bonding pads 14 and a plurality of semiconductor circuits 16 surrounded by the bonding pads. The bonding pads typically have an aluminized, copper, gold bump, solder bump, or similarly annealed surface. The bonding pads serve as an electrical intermediary between the world outside of the integrated circuit 16 and the circuit itself. Small wires (not shown) interconnect the bonding pads 14 with the semiconductor circuit 16. Another set of small wires (also not shown) interconnect the bonding pads with external pins (not shown) in a ceramic, or dual-in-line package (DIP) for connecting the integrated circuit into a larger circuit.

Figure 3:
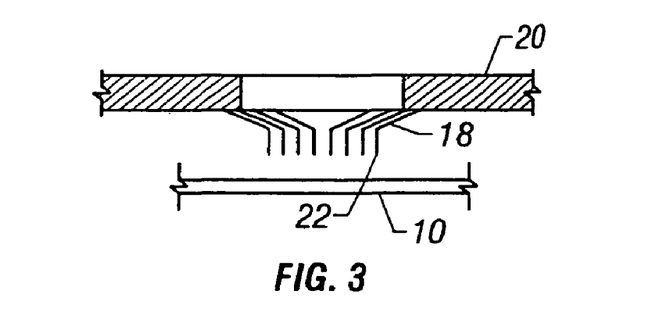
FIG. 3 is a sectional, schematic side elevation view of a probe card having a plurality of probe pins, and of a semiconductor wafer.

As shown in FIG. 3, the bonding pads also provide positions for electronic probe pins 18 on a semiconductor probe card 20 to contact the bonding pads. As is well known to those of ordinary skill in the art, the semiconductor probe card 20 is received in a prober machine (not shown) as well as is the semiconductor wafer 10 so that when the probe pins 18 are in contact with the bonding pads 14 a plurality of electronic tests can be performed on the semiconductor circuit 16.

Figure 12:
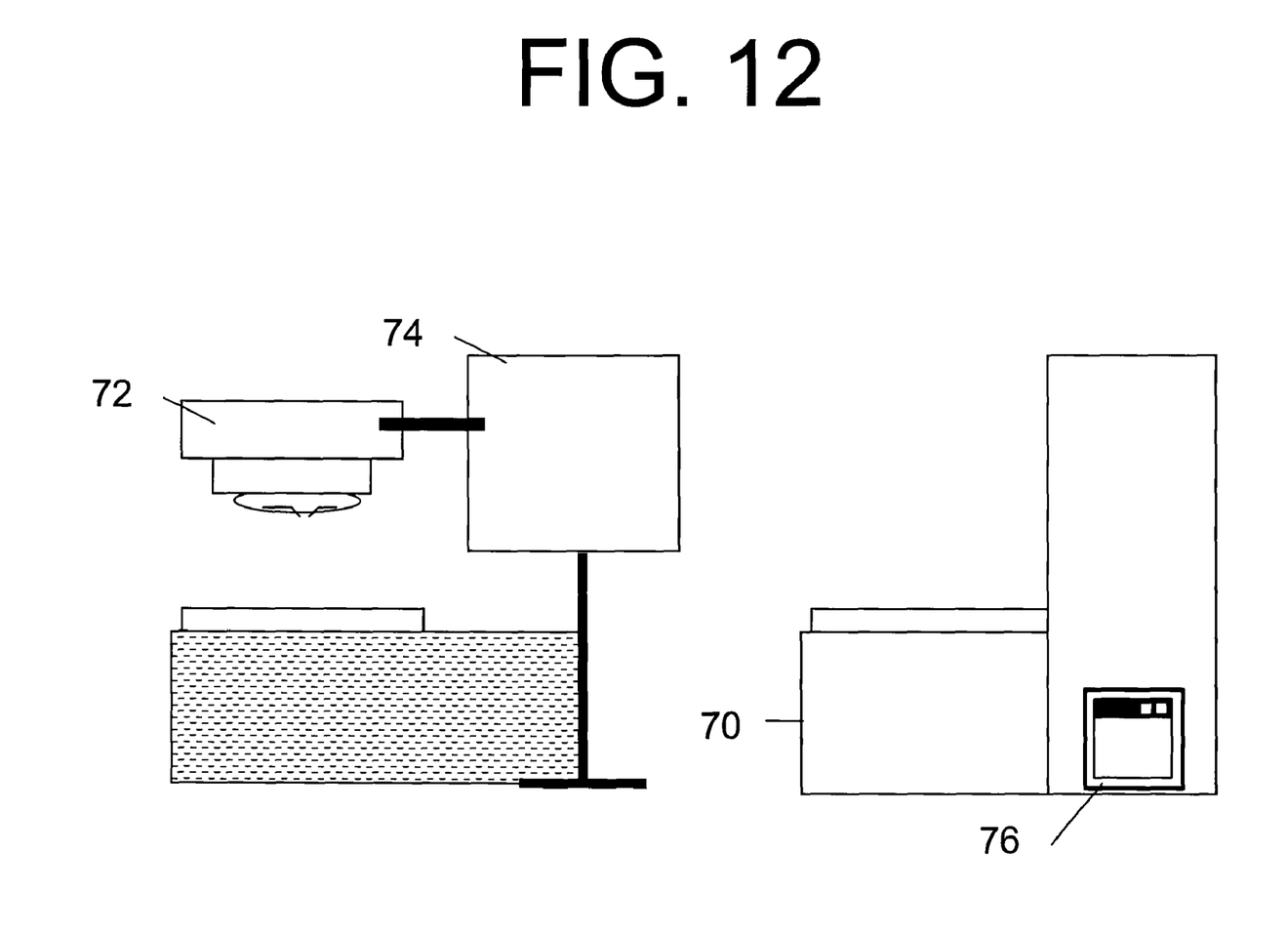
FIG. 12 is a block schematic of semiconductor test equipment according to certain aspects of the invention.

As is also well known to those of ordinary skill in the art, it is common for the probe card pins 18 to become misaligned during use. Once the misalignment has exceeded predetermined tolerances, the probe card must be reworked and/or remanufactured to bring the tips 22 of the probe pins back into planarity, as well as back into horizontal registration with respect to one another, and with respect to the probe card 20. For this purpose, a variety of machines known as probe card analyzers 70 (as indicated in FIG. 12) have been constructed in which a relatively hard testing surface often termed a "check plate" is positioned in place of the semiconductor wafer 10. The check plate may have a very hard transparent window manufactured from sapphire or another synthetic crystal, or may be constructed from a tool hardened steel having various electrical discontinuities thereon so that the horizontal positioning of the respective pin tips 22 may be measured with respect to one another and with respect to the probe card. It is common during such testing that probe pins are over-traveled in the vertical (i.e. "Z") direction and will "scrub" along the surface of the check plate. As best seen in dashed lines in FIG. 4 at reference number 24, a probe card analysis scrub pattern has a well defined starting or "touch down" point 26 and a well defined end of travel point 28. Unfortunately, due to the hardness of the check plate surface, this scrub pattern does not match a corresponding scrub mark 30 shown in solid lines in FIG. 4 made in an actual bonding pad or test wafer. Scrub mark 30 can be electronically imaged 72 by an appropriate scrub mark analysis machine 74. The starting or touch down point 32 of the scrub mark in an aluminized surface such as a semiconductor die bonding pad is difficult to discern because the probe pin 18 is applying relatively little force to the aluminized surface. In fact, the touch down point on the aluminized surface should be where the touch down point 26 is shown when the same probe touches down on a probe card analysis check plate. However, the probe "skates" along the surface of the aluminized bonding pad before it begins to make a discernable mark, and the distance between the touch down point 26 as measured by the probe card analysis machine 70, and the touch down point 32 as measured by the scrub mark analysis machine 74 has been termed by the Applicant as "skating distance" 34.

Figure 4:
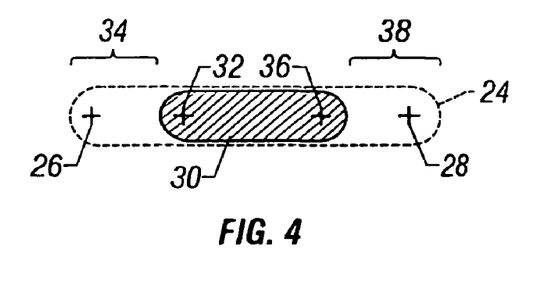
FIG. 4 is a schematic representation of a scrub mark analyzed by a scrub mark analysis machine, and a scrub pattern analyzed by a probe card analysis machine.

Similarly, the end of travel 36 of the probe tip in either an aluminized bonding pad, or the surface of a test wafer in a scrub mark analysis machine 74 can fall short of the end of travel point 28 as indicated by the probe card analysis machine 70. This can occur because shortly after the probe touches down at touch down point 32, the probe tip digs into the aluminized surface of the bonding pad as a plow enters the ground. The coefficient of friction between the probe pin tip and the bonding pad quickly rises. As a result thereof, the probe "stubs" into the metalized surface when the force due to friction equals the forward force applied by the prober machine through the probe pin. The distance between the end of travel point 36 as measured by the scrub mark analysis machine 74 and the end of travel point 28 measured by the probe card analysis machine 70 has been defined by the Applicant as the "stubbing" distance 38.

By combining scrub mark analysis data from the scrub mark analyzer 74 and scrub pattern data from the probe card analysis machine 70, it is possible to predict more accurately the behavior of a probe pin on a semiconductor die metalization pad, as well as isolate whether the source of errors in probe pin position is due to the prober machine, or the position of the probe pins with respect to the probe card itself.

Figure 6:
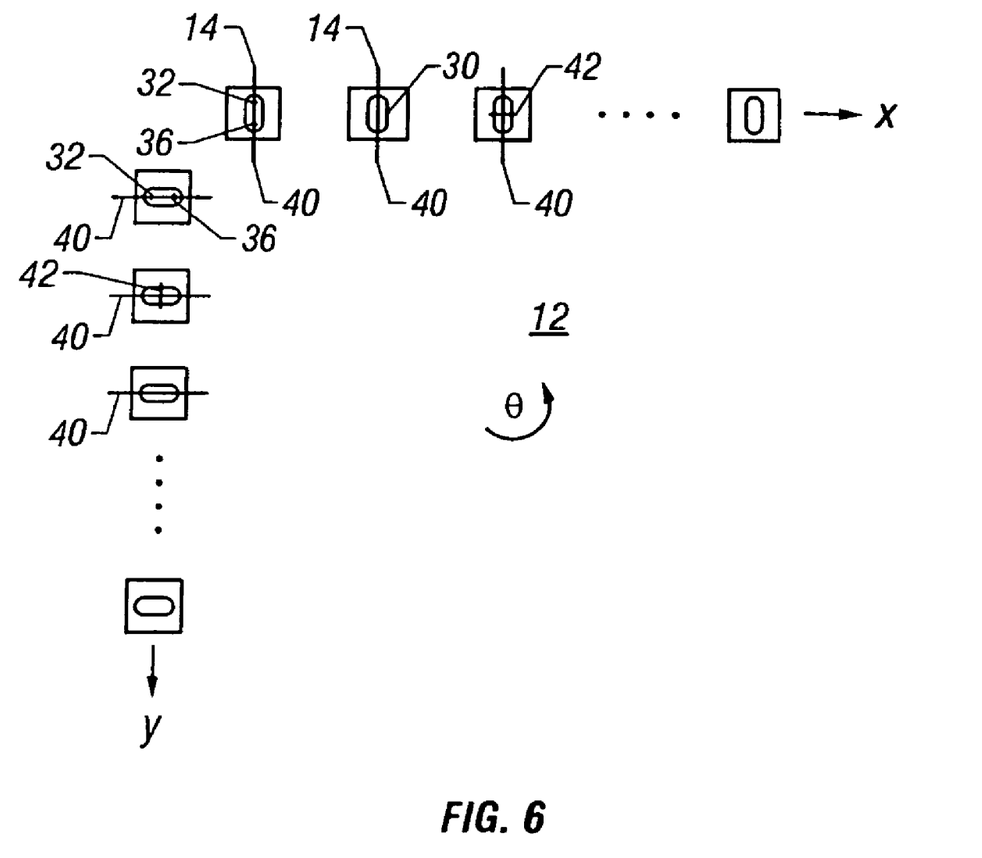
FIG. 6 is a schematic representation of one method of combining data sets.

With reference to FIG. 6, in certain embodiments of the invention, correction factors typically expressed in X and Y vectors (left-right and up-down, respectively), and as a rotational angle θ are calculated so as to minimize differences in data sets relating to the stubbing distance 38 shown in FIG. 4. FIG. 6 illustrates a representative set of orthogonal bonding pads 14 on a semiconductor die surface 12 in the X and Y directions. The pads have scrub marks 30 such as are to be analyzed by a scrub mark analysis machine 74. In an iterative fashion, a correction factor in the X, Y and θ directions is added to a combined data set stored in a computer by a conventional computer program, such as the Excel database program available from Microsoft Corporation, Redmond, Wash. An error value is then associated with the stubbing distance 38 measured for each probe pin 18 associated with a bonding pad 14. As the X, Y and θ correction factors or "offset values" are incremented, a minimum error value represented by the stubbing distance 38 can be found. That minimum error value and the corresponding X, Y and θ offsets can quantitatively represent the degree to which the probe card and prober machine combination are out of tolerance. The error value may be calculated by simple summation of the stubbing distance 38, as described above by averaging all of the stubbing distances for all of the pads; or by summing the squares of the differences between the average stubbing values and the differences between the end of travel positions between the probe card analysis machine 70 and scrub mark analysis machine 74; or, a standard deviation of the ending position differences between the scrub mark analysis 74 and probe mark analysis 70 machines. The specific numerical method which the artisan of ordinary skill uses is an inconsequential activity with respect to the claimed invention.

Alternatively, in certain embodiments of the invention, the error value may be associated with the skating distance 34 shown in FIG. 4. In this alternate embodiment of the invention, an error value may be assigned to the sum of the differences between the average skating distance 34 for all of the scrub marks 30 and the sum of the differences between the touch down points 26 and 32 as measured by the probe card analysis machine 70 and scrub mark analysis machine 74, respectively. As stated with respect to the first embodiment of the invention, a sum of the difference of the squares, or a standard deviation technique may also be used to define the error value. As stated with respect to the first embodiment, in this alternate embodiment correction factors in the X direction, Y direction and θ direction are incrementally applied to the measured locations of the touch down points correlating to the skating distance 34 until the error value is minimized. The correction factors in X, Y and θ thus relate to the degree to which the probe card and prober machine combination are out of tolerance.

In a certain other embodiments of the invention, the center of the scrub marks is defined by the scrub mark analysis machine 74 mathematically as a straight line between the touch down point 32 and end of travel point 36 measured by the scrub mark analysis machine 74 and a mathematical straight line between the touch down point 26 and end of travel point 28 as defined and measured by the probe card analysis machine 70. This scrub mark center line 40 can also be directly measured by the scrub mark analysis machine 74 from the left or right edge of the bonding pad 14 in the X-axis and the top or bottom edge of the bottom edge in the Y-axis as shown in FIG. 6. The error value can then be assigned as the sum of the absolute values of the center lines 40 with respect to the edge of their respective bonding pad or as the sum of the squares of those measurements. By incrementing correcting factors in the X, Y and θ directions, the minimum error value resulting from that incremental analysis gives the X, Y and θ correction factors which are representative to the degree to which the probe card and prober machine combination are out of tolerance.

In yet another embodiment of the invention, the minor axis 42 of the scrub marks can be measured by both the scrub mark analysis machine 74 and the probe mark analysis machine 70 and the error factors applied as set forth above with respect to the third embodiment of the invention.

Furthermore, by comparing the data sets collected for the scrub patterns from the probe card analysis machine 70, the scrub marks from the scrub mark analysis machine 74, and the orientation of the errors as shown in FIG. 5, it can be determined whether the errors are due to misalignment of the probes with respect to the card, or the card with respect to the prober machine. These errors are particularly apparent where the dies being tested are located at the perimeter of the semiconductor wafer.

It may also be desirable to scrub the test wafer 10 in the probe machine with a hot chuck or other means for heating the wafer and the probe card 20 to the approximate operating temperature of an integrated circuit of a number of embodiments of the invention have been described.

Probe card data may be generated by removing all prober errors from the scrub mark data set. Within the probe card data set, multiple probe card parameters are reported, based on the probe's scrub size, position, repeatability, and correlation patterns. Software 76 is used that has acquisition, staging, image processing, image analysis and informatics (database) components.

As described above, wafer probe marks may reveal a great deal about the entire semiconductor testing process. Wafer probe mark and die pad properties may provide basic measurements from which a hierarchy of other data sets may be calculated. For example, from wafer probe mark and die pad measurements, pad-to-pad data may, in turn, be calculated. From the pad-to-pad data, die data may be obtained from which die-to-die, wafer, wafer-to-wafer, and finally wafer lot and process setup data may be calculated. Applying regression and clustering methodologies to wafer probe mark and pad data may enable deduction of a number of semiconductor test system parameters including, but not limited to, information regarding the probe card, the prober setup, the probing operation, the semiconductor-manufacturing process, interaction of the various components of the semiconductor-manufacturing process, and the semiconductor-manufacturing environment. The wafer probe mark analysis process may involve the following steps: measure and analyze wafer probe mark and pad data, analyze die patterns, and analyze wafer patterns.

In certain embodiments of the present invention, wafer probe mark analysis may be conducted using wafer probe marks imaged or otherwise observed by a scrub mark analyzer, or wafer probe mark analyzer. A system for providing advanced wafer probe mark analysis may comprise of a precision stage, a wafer handler, an imaging system and a software analysis and controller package. In many embodiments, the system may automatically load and unload wafers from a cassette, identify the orientation of the wafer, read or otherwise obtain wafer identification, position the wafer under the imaging system, process the input image, and perform wafer probe mark data analysis.

Figure 7:
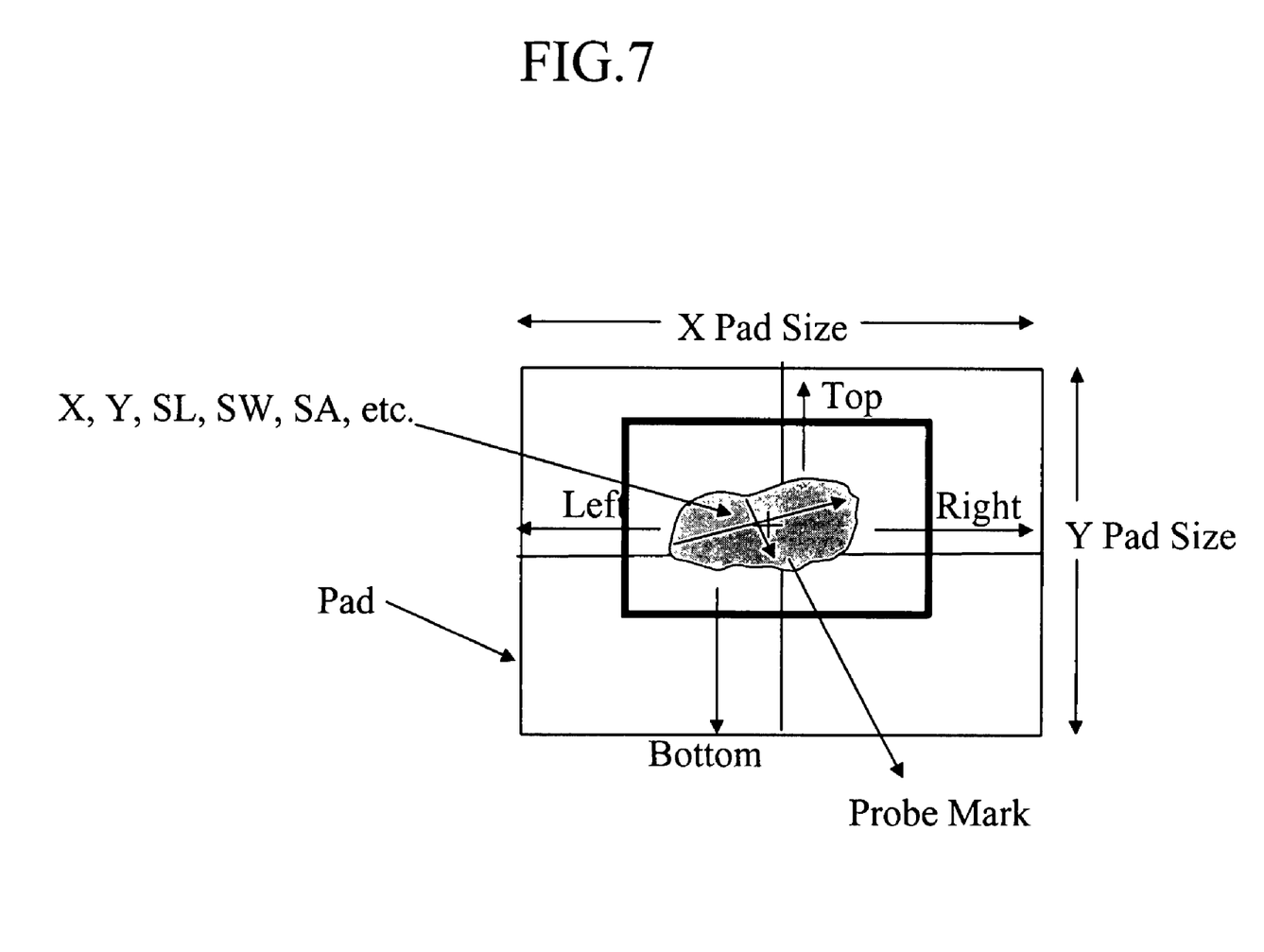
FIG. 7 illustrates an example of a wafer probe mark and die pad or other defined location measurements.

In certain embodiments, an advanced wafer probe mark analyzer may be operable to measure wafer probe mark properties, i.e. measure wafer probe marks relative to die pad positions. Such data may be referred to collectively as "pad data". More specifically, pad data may include, but is not limited to, wafer probe mark length, width, size, angle, orientation, center, depth and position relative to a pad or other defined location. Data may also be collected regarding die pad size, position, area, center, and orientation, as well as any signs of die pad damage caused during the manufacturing process. FIG. 7 illustrates an example of wafer probe mark and die pad or other defined location measurements that may be acquired and utilized in certain embodiments of the present invention.

In certain embodiments, the comparison of data between various pads, pad-to-pad data analysis, may show variation of wafer probe marks made by a particular probe on a probe card from one pad to another. Standard deviation, maximum, minimum, range, and other parameters may be calculated for pad-to-pad data. Normalization of such data may also be desirable in certain circumstances. Pad-to-pad may also be obtained over a probe card's life to show tends or predict card life span or retirement.

Die pattern analysis, or die model fitting, may be conducted by utilizing summarized pad data. Statistical analyses may be performed on the pad data from each die tested. Die data may have two components, model fit parameter offsets and summarized core pad data. Systematic offsets may be derived by fitting a model to the pad x, y, and probe mark data. Summarized data values may be utilized to calculate statistical data such as standard deviation, maximum, minimum, range, and other parameters. The die model fit data may function as a core data set used in die-to-die variation analysis, wafer level summary analysis and as a normalizing parameter. Die pattern data may provide information regarding prober stepping offset, deflection errors of a prober stepping under load, and scaling accuracy at temperature data, summary information on probe mark errors.

FIG. 5 schematically illustrates aspects of die pattern analysis through a series of semiconductor die 12 having bonding pads 14 upon which wafer probe marks or scrub marks 30 were made as a result of the probing process. FIG. 5A illustrates a die 14 in which all of the probe marks 30 are substantially centered in the pads and are of desired length or overtravel. The die and accompanying wafer probe mark patterns of FIG. 5A may be considered the result of a theoretical error-free semiconductor manufacturing and probing process.

Figure 5A:
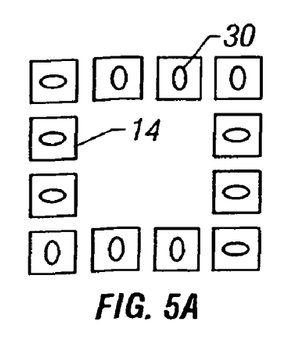
FIG. 5 (a through h) is a schematic representation of semiconductor die bonding pads having scrub marks thereon due to various probe card and/or prober machine errors.
Figure 5B:
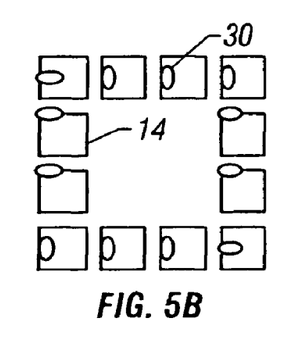
Figure 5C:
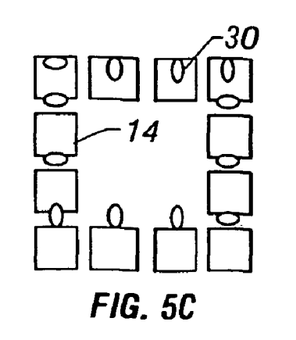
Figure 5D:
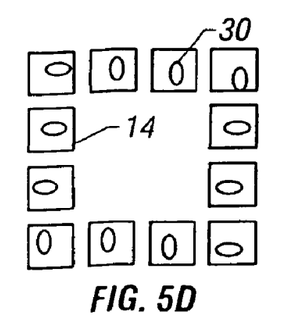

X and Y setup and probe card yaw errors are illustrated in FIGS. 5B-5D. FIG. 5B illustrates an example of a die 14 in which all of the probe marks 30 are offset in the negative X direction. FIG. 5C illustrates an example of a die 14 in which all of the probe marks 30 are offset in the positive Y direction. FIG. 5D illustrates an example of a die 14 in which all of the probe marks 30 are rotated about the Z-axis in a clockwise direction. These types of error may be considered probe-to-pad alignment errors and may be a result of the prober machine's alignment of the probe card to the wafer. The illustrated errors may be observed in each die tested across an entire wafer.

Figure 5E:
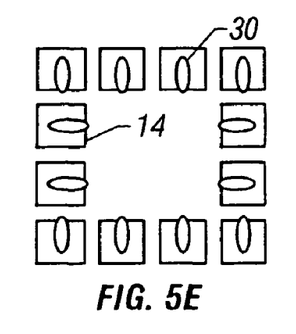
Figure 5F:
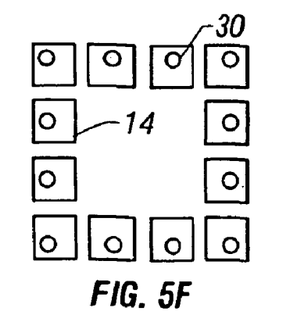
Figure 5G:
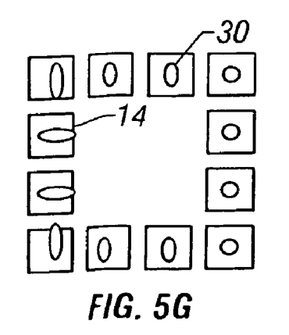
Figure 5H:
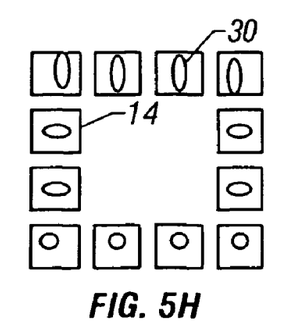

Probe card fixturing or docking errors are illustrated in FIGS. 5G and H. FIG. 5G illustrates an example of elongated wafer probe marks 30 on the left hand side of the die 12 and very short wafer probe mark 30 on the right hand side of the die 12. This configuration indicates a roll error about the Y-axis. FIG. 5H illustrates an example of elongated wafer probe marks 30 on the top of the die 12 and very short wafer probe marks 30 on the bottom of the die 12. This configuration indicates a pitch error about the X-axis. Assuming that the probe needle tips of the probe card are parallel and planar, Roll and pitch errors may be a result of problems in the fixturing or docking of the probe card to the prober machine. If the probe card is not docked properly, the probe needle tips may not be maintained parallel to the wafer and a resulting lengthening and shortening of the wafer probe marks may be produced.

FIGS. 5E and F illustrate various degrees of overtravel error that may occur in the probing process. FIG. 5E illustrates an example of excessively long wafer probe marks 30 in both the X and Y directions. This pattern may indicate that the prober is exerting too much Z translation or force on the probe card pins. Conversely, FIG. 5F illustrates an example of pads 14 with small wafer probe marks that have little or no elongation. These patterns may indicate that the prober is applying insufficient Z translation or pressure on the probe card pins.

In certain embodiments, wafer pattern analysis, or wafer model fitting, can include generating estimates of how the prober stage is affecting wafer probe mark position and size. Parameters previously discussed with respect to pad pattern analysis may be analyzed across an entire wafer, e.g. X, Y, offset, probe card parallelism, and probe card θ. Additional parameters calculated and analyzed may include prober stage related characteristics such as wafer to prober stage θ, overtravel variation, X and Y prober stage stepping or scaling, prober stage deflection, and probe card accuracy and repeatability.

Figure 8:
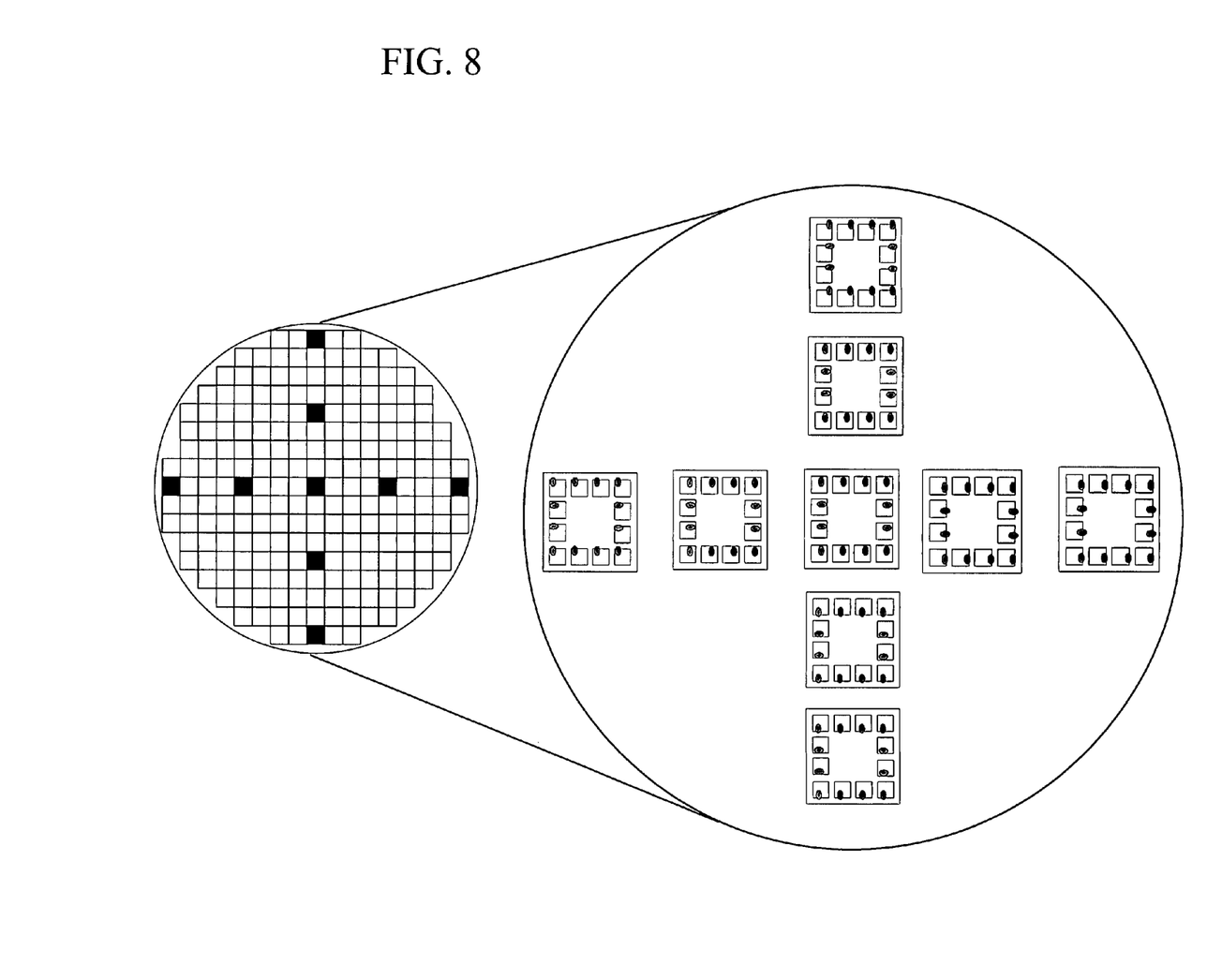
FIG. 8 illustrates an example of a die sampling pattern for a semiconductor wafer.

One skilled in the art will appreciate that it may not be necessary, or desirable, to sample all die on a particular wafer. Die sampling patterns across a wafer may take numerous forms and may depend upon factors such as, the wafer map, the type and quality level of the semiconductors being tested, as well as the cost and time budget considerations. FIG. 8 illustrates an example of a die sampling pattern for a semiconductor wafer 10. In some probers, the probe card has the capacity to test more than one die at a time. In such cases, the plurality of die is referred to as a multi-device under test ("Multi-DUT"). The present invention may also test Multi-DUTs as well as individual dies.

Figure 9:
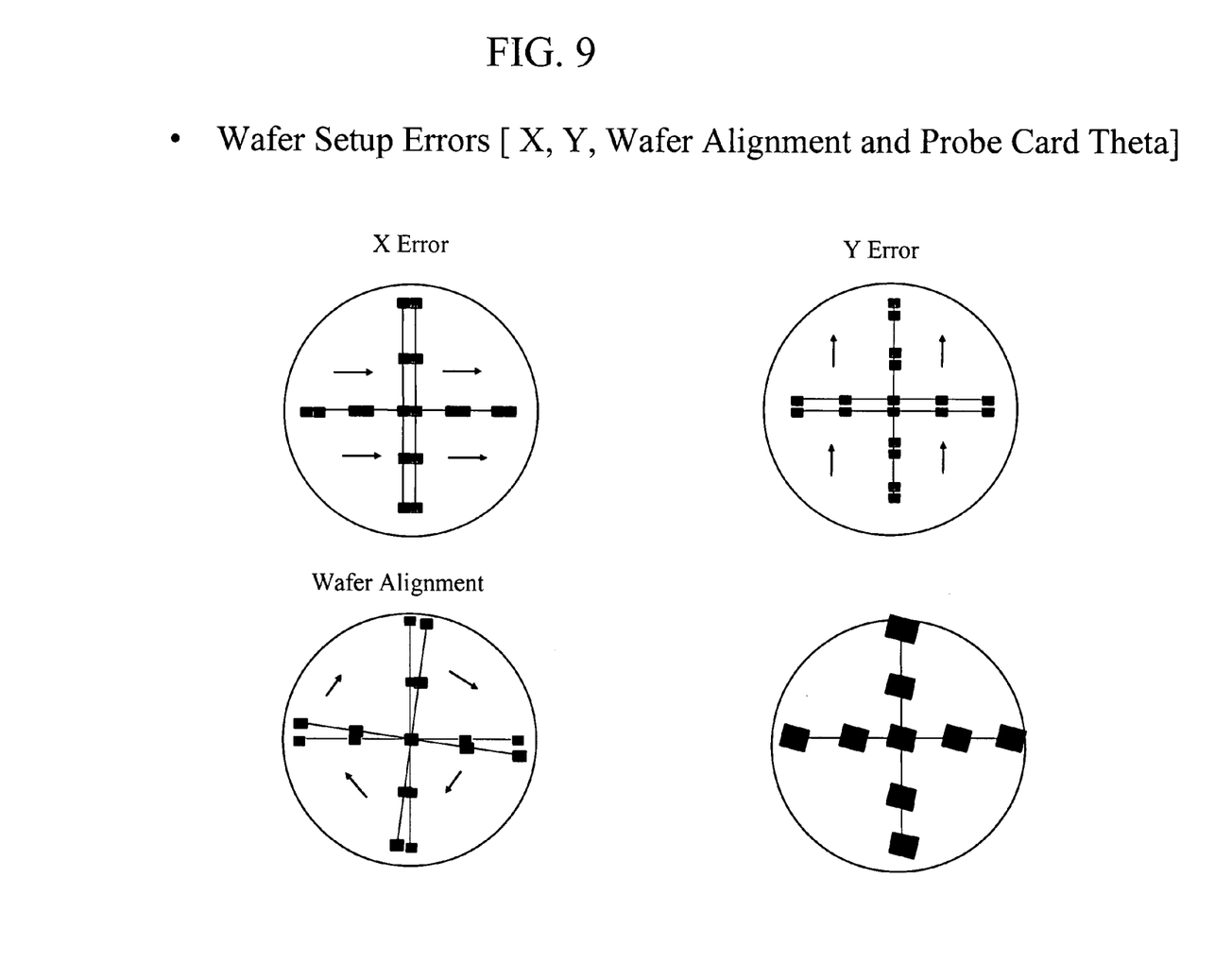
FIG. 9A-D illustrate examples of wafer analysis.

In certain embodiments, whether the magnitude of a specific type of error is consistent or variable across a wafer can be determinative of whether the error is a result of a problem in the docking of a probe card to a prober machine or a problem with operation of the prober. FIG. 9A-D illustrate such concept at wafer level. In the example illustrated in FIG. 5C, if a positive Y offset is observed of equal magnitude for each die probed across an entire wafer (as represented by the offset pairs of boxes in FIG. 9B), such a pattern may be indicative of a prober setup error. The offset between the boxes is relatively consistent across the entire wafer. FIGS. 9A and 9D illustrate examples of prober X setup error and θ alignment of probe card, or yaw, prober setup errors respectively. In each case the error observed is relatively consistent for each die across the wafer.

In another example, a prober operation error (i.e. a problem with the operation of the prober) such as a wafer alignment or wafer to prober stage θ error, may result in an error that increase in magnitude as the prober is translated away form the center of the wafer. FIG. 9C illustrates this in the case of wafer alignment error. It will be appreciated that the spacing, or misalignment, between the boxes can increase for die further to the periphery of the wafer. Wafer alignment, or wafer to prober stage error, may result from an error in the rotational alignment of the wafer relative to the prober stage.

Typically, prober stage orthogonality errors are closely related to wafer alignment errors. In a properly functioning prober, the stage is typically aligned to fiducials oriented along a primary axis, the X or Y axis of a wafer. If the prober stage is not properly translating along the primary axis or at right angle to the primary axis, wafer probe marks may appear with specially limited rotational errors.

Figure 10:
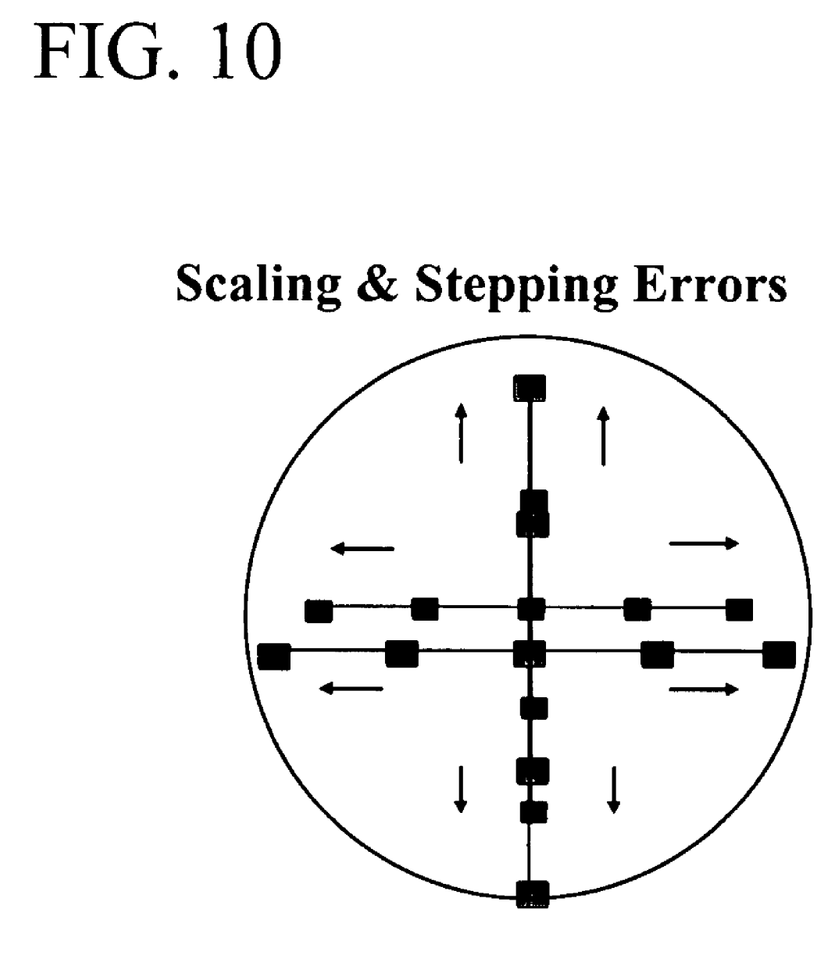
FIG. 10 illustrates scaling or stepping error analysis.

Another error that can be identified through wafer pattern analysis is X and Y wafer scaling or stepping errors, as illustrated in FIG. 10. X and Y wafer scaling can analyze whether the prober machine's die-to-die step size along a particular axis is accurate. FIG. 10 illustrates a situation in which both X and Y stepping error exists.

Figure 11:
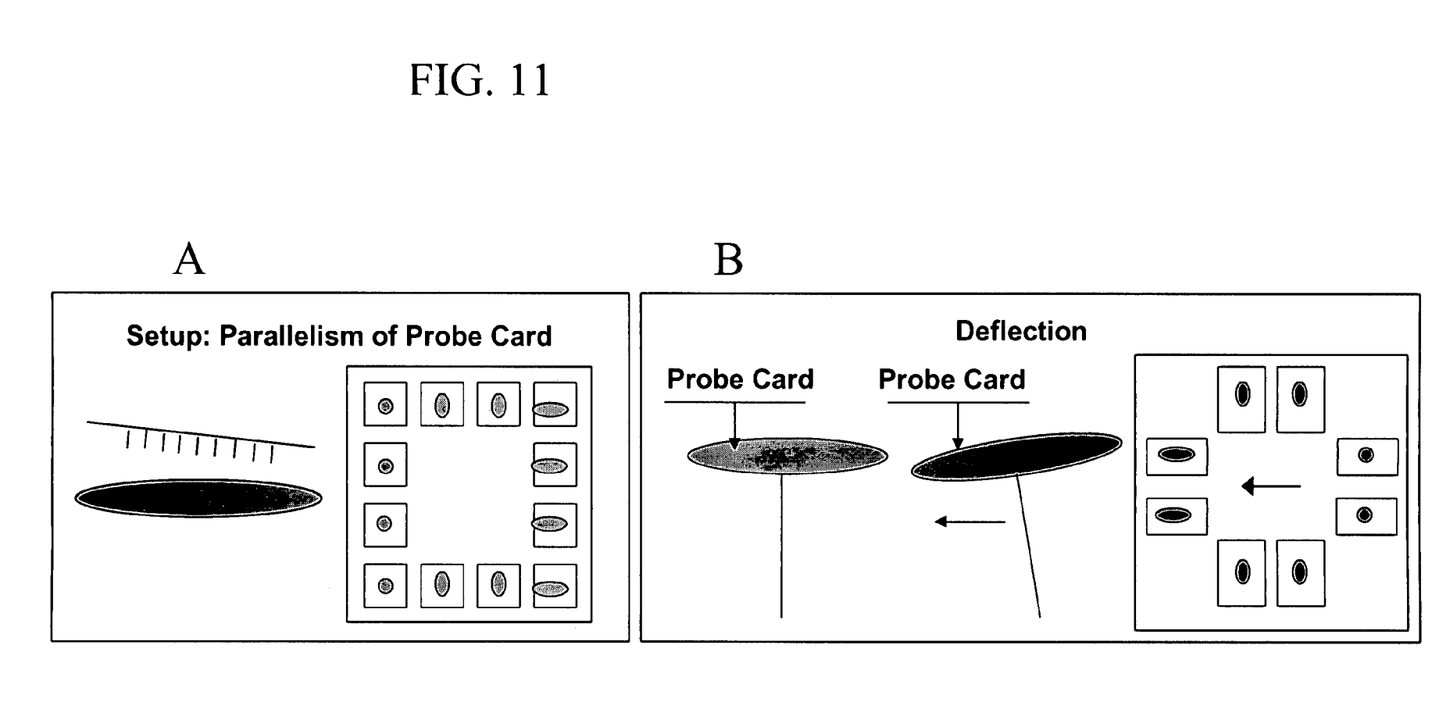
FIG. 11 illustrates an example of the dynamics of a deflection error.

In certain embodiments of the present invention stage deflection errors can be characterized. FIG. 11 illustrates an example of the dynamics of a deflection error, the wafer probe marks resulting from a deflection error, and difference between a deflection error and a prober card tip parallelism error. Deflection can represent the degree to which the translation of the prober stage under load of the probe card pins affects wafer probe mark patterns. In the case of a probe card parallelism error, the wafer probe mark pattern shown in FIG. 11A may be consistent across the entire wafer. In contrast, deflection may be determined by examining the differential in wafer probe mark length for each touchdown and performing a trend anaylsis across the wafer. Referring to the example of FIG. 11B, as the probe card is stepped from the left edge of the wafer to the right edge of the wafer, the wafer probe mark pattern may change from that shown in FIG. 11B, to an ideal wafer probe mark pattern, as shown in FIG. 5A, when the probe card probes the center of the wafer, and finally to a wafer probe mark pattern that is a mirror image of the pattern of FIG. 11B when the probe card probes the right edge of the wafer. The lengthening and shortening of the wafer probe marks may be a percentage of the actual translation of the prober stage.

In certain embodiments of the present application, additional error such as, variations wafer probe mark overtravel, yaw, and roll across a wafer may also be calculated. It will be appreciated by one skilled in the art that, while the above errors are discussed independently, typical test situations can result in a combination of many error types. Embodiments of the present invention can be configured to extract error data for specific types of error from a data set that represents wafer probe marks resulting from a combination of errors or component interactions. In certain embodiments of the present application, X and Y residual errors may also be determined after all model patterns are removed from the data. The remaining residual error may represent a random type of noise or a high order type of error in the manufacturing or testing process.

In certain other embodiments, probe card error data may also be obtained by removing all prober related error from the wafer probe mark data set. In this manner probe card accuracy and repeatability may be characterized.

In certain embodiments of the present invention, a simple aluminized surface may be probed and the morphology and location of the scrub marks can be used to analyze the probe card and the prober system in the absence of an actual semiconductor wafer.

It will be understood that various modifications may be made without departing from the spirit and scope of the invention. Accordingly, other embodiments are within the scope of the following claims.

What is claimed is:

1. A method of analyzing a semiconductor test process comprising:
   capturing images of a plurality of probe marks formed on a semiconductor wafer having a plurality of integrated circuits;
   determining characteristics of the plurality of probe marks by analyzing said images; and
   identifying one or more test process errors based on said characteristics, said identifying comprising:
      correlating characteristics of different probe marks in the plurality of probe marks to one or more test process errors; and
      associating each of said one or more test process errors with a particular type of test process error based on said correlation.

2. The method of claim 1 wherein said determining includes analyzing images of selected probe marks to obtain one or more of said characteristics.

3. The method of claim 2 wherein, said analyzing includes acquiring one or more measurements of selected probe marks, the one or more measurements including length, width, size, angle, orientation, center, depth.

4. The method of claim 3 wherein said type of process error includes a prober set up error.

5. The method of claim 4 wherein said prober set up error is representative of a prober fixturing error.

6. The method of claim 3 wherein said type of process error includes a prober operation error.

7. The method of claim 6 wherein said prober operation error comprises a prober stage error.

8. The method of claim 6 wherein said prober operation error comprises an X-axis alignment error.

9. The method of claim 6 wherein said prober operation error comprises a Y-axis alignment error.

10. The method of claim 6 wherein said prober operation error comprises a wafer alignment error.

11. The method of claim 6 wherein said prober operation error comprises an orthogonality error.

12. The method of claim 6 wherein said prober operation error comprises a prober scaling error.

13. The method of claim 6 wherein said prober operation error comprises variation in probe card pin overtravel.

14. The method of claim 6 wherein said prober operation error comprises a deflection error.

15. The method of claim 5 wherein said prober fixturing error comprises a probe card pitch error.

16. The method of claim 5 wherein said prober fixturing error comprises a probe card roll error.

17. The method of claim 4 wherein said prober set up error comprises a probe-to-pad alignment error.

18. The method of claim 17 wherein said probe-to-pad alignment error comprises an X-axis setup error.

19. The method of claim 17 wherein said probe-to-pad alignment error comprises a Y-axis setup error.

20. The method of claim 17 wherein said probe-to-pad alignment error comprises a probe card yaw error.

21. The method of claim 1 wherein identifying comprises comparing a first set of probe marks corresponding to first integrated circuit with a second set of probe marks corresponding to a second integrated circuit.

22. The method of claim 1 wherein the plurality of probe marks correspond to marks formed in a plurality of die on the semiconductor wafer.

23. The method of claim 1 wherein the plurality of probe marks correspond to multiple touchdowns of a probe card against the semiconductor wafer.

24. A computer readable medium for analyzing semiconductor test process error and interaction, said medium encoded with data and instructions causing an apparatus executing said instructions to:

capture images of a plurality of probe marks formed in a semiconductor wafer having a plurality of integrated circuits;

determine characteristics of a plurality of probe marks by analyzing said images; and identify one or more test process errors based on said characteristics by:

correlating characteristics of different probe marks in the plurality of probe marks to one or more test process errors;

associating each of said test process errors with a particular type of test process error based on said correlation.

25. The computer readable medium of claim 24, wherein determination of said characteristics includes analyzing images of selected probe marks to obtain one or more of said characteristics.

26. The computer readable medium of claim 25, wherein determination of said characteristics includes acquiring one or more measurements of selected probe marks, the one or more measurements including length, width, size, angle, orientation, center, depth.

27. The computer readable medium of claim 26, wherein said type of error includes a prober set up error.

28. The computer readable medium of claim 26 wherein said type of error includes a prober operation error.

* * * * *

UNITED STATES PATENT AND TRADEMARK OFFICE
CERTIFICATE OF CORRECTION

| | | |
|---|---|---|
| PATENT NO. | : 7,750,622 B2 | Page 1 of 1 |
| APPLICATION NO. | : 11/479822 | |
| DATED | : July 6, 2010 | |
| INVENTOR(S) | : John T. Strom | |

It is certified that error appears in the above-identified patent and that said Letters Patent is hereby corrected as shown below:

ON THE TITLE PAGE:

Column 1 (Title), line 5, delete "ANALYSIS" and insert in place thereof --ANALYSIS,--.

IN THE SPECIFICATION:

Column 1, line 5, delete "ANALYSIS" and insert in place thereof --ANALYSIS,--.

Column 5, line 50, delete "can" and insert in place thereof --will--.

Column 9, line 21, delete "form" and insert in place thereof --from--.

Column 9, line 53, delete "anaylsis" and insert in place thereof --analysis--.

Signed and Sealed this

Seventh Day of September, 2010

David J. Kappos
*Director of the United States Patent and Trademark Office*